US011011528B2

(12) United States Patent
Reznicek et al.

(10) Patent No.: US 11,011,528 B2
(45) Date of Patent: May 18, 2021

(54) ASYMMETRIC GATE EDGE SPACING FOR SRAM STRUCTURES

(71) Applicant: International Business Machines Corporation, Armonk, NY (US)

(72) Inventors: Alexander Reznicek, Troy, NY (US); Ruilong Xie, Niskayuna, NY (US); Chun-Chen Yeh, Danbury, CT (US); Chen Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/406,121

(22) Filed: May 8, 2019

(65) Prior Publication Data

US 2020/0357805 A1 Nov. 12, 2020

(51) Int. Cl.
| | | |
|---|---|---|
| *H01L 27/11* | (2006.01) | |
| *H01L 27/02* | (2006.01) | |
| *H01L 29/423* | (2006.01) | |
| *H01L 21/762* | (2006.01) | |
| *H01L 29/66* | (2006.01) | |
| *H01L 21/3213* | (2006.01) | |
| *H01L 27/092* | (2006.01) | |

(52) U.S. Cl.
CPC .... *H01L 27/1104* (2013.01); *H01L 21/32139* (2013.01); *H01L 21/76224* (2013.01); *H01L 27/0207* (2013.01); *H01L 27/0924* (2013.01); *H01L 27/1116* (2013.01); *H01L 29/42364* (2013.01); *H01L 29/66545* (2013.01)

(58) Field of Classification Search
CPC ........... H01L 29/66545; H01L 27/0886; H01L 29/785; H01L 27/0924
See application file for complete search history.

(56) References Cited

U.S. PATENT DOCUMENTS

| | | | |
|---|---|---|---|
| 4,849,376 | A | 7/1989 | Balzan et al. |
| 4,965,218 | A | 10/1990 | Geissberger et al. |
| 7,064,491 | B2 | 6/2006 | Horsky et al. |
| 7,563,701 | B2 | 7/2009 | Chang et al. |
| 7,605,428 | B2 | 10/2009 | Williams et al. |
| 7,709,314 | B2 | 5/2010 | Madurawe |
| 7,947,543 | B2 | 5/2011 | Kim |
| 9,960,077 | B1 | 5/2018 | Zang et al. |

(Continued)

FOREIGN PATENT DOCUMENTS

WO 2018004680 A1 1/2018

OTHER PUBLICATIONS

Hisamoto et al., "FinFET-A Self-Aligned Double-Gate MOSFET Scalable to 20 nm", IEEE Transactions on Electron Devices, vol. 47, No. 12, Dec. 2000, pp. 2320-2325.

*Primary Examiner* — Selim U Ahmed
*Assistant Examiner* — Evan G Clinton
(74) *Attorney, Agent, or Firm* — David K. Mattheis; William H. Hartwell; Nicholas L. Cadmus

(57) ABSTRACT

An integrated circuit having logic and static random-access memory (SRAM) devices includes at least three active regions with gate terminals. Dielectric pillars are disposed between the active regions of the integrated circuit. A pillar is disposed symmetrically between two active regions of the logic device. A pillar is disposed asymmetrically between a p-channel field effect transistor (pFET), and an n-channel field effect transistor (nFET) of the SRAM device.

12 Claims, 12 Drawing Sheets

(56) References Cited

U.S. PATENT DOCUMENTS

| | | | |
|---|---|---|---|
| 2016/0225767 A1* | 8/2016 | Liu | H01L 29/0847 |
| 2016/0233298 A1 | 8/2016 | Webb et al. | |
| 2017/0186882 A1 | 6/2017 | Koldiaev et al. | |
| 2018/0204932 A1 | 7/2018 | Mehandru et al. | |
| 2020/0091311 A1* | 3/2020 | Hsu | H01L 21/823431 |

* cited by examiner

ASYMMETRIC GATE EDGE SPACING FOR SRAM STRUCTURES

BACKGROUND

The disclosure relates generally to complementary metal oxide semiconductor (CMOS) device structures. The disclosure relates particularly to CMOS metal oxide semiconductor field effect transistor MOSFET structures including both logic and memory elements.

Integrated circuit designers continue to increase the number of circuit elements while also reducing the scale of the individual elements. Self-aligned gate edge elements, where a single continuous gate element is formed and then gate cuts (CT) are created to yield discrete active gate elements provide a means to advance circuit element density.

SUMMARY

Aspects of the invention disclose methods for forming circuits, components and systems having self-aligned gate edges, and the formed structures. In one aspect, an integrated circuit having logic and static random-access memory (SRAM) devices includes at least three active regions with gate terminals (gates). The integrated circuit may comprise more than three active regions. Dielectric pillars are disposed between the active regions of the integrated circuit. A pillar is disposed symmetrically between two active regions of the logic device. A pillar is disposed asymmetrically between a p-channel field effect transistor (pFET), and an n-channel field effect transistor (nFET) of the SRAM device.

In one aspect an integrated circuit having logic and SRAM devices is fabricated by a method which includes providing a semiconductor structure having a substrate and a plurality of fins extending upward from the substrate. A first sacrificial gate layer is formed on the fins of the circuit. A mask layer is formed above a portion of the first sacrificial layer, part of the first sacrificial gate layer is not masked. The unmasked portion of the first sacrificial gate layer is removed. A second sacrificial gate layer is formed. Part of the second sacrificial gate layer is removed, defining symmetrically and asymmetrically spaced voids in the first and second sacrificial gate layers. Dielectric pillars are then formed in the symmetrically and asymmetrically spaced voids of the structure.

DETAILED DESCRIPTION

As MOSFET device densities increase, the corresponding device dimensions decrease and existing method for structure creation are not able to create the smaller elements needed to support densification. As an example, in a fin field effect transistor (finFET) structure, the spacing between two adjacent active regions can be limited by the ability to precisely locate the CT pillar defanging the opposing gate (gate terminal) edges. Each gate must extend beyond the fin into the isolation space between active regions by a minimum amount. The spacing between adjacent region fins includes twice the minimum gate extensions and the width of a CT pillar (plus the pillar width process variation) may be 40 nm. The gate extension to accommodate the high-dielectric, metal gate (HK/MG) stack may be 14 nm, and the process variation may add 5 nm to the CT width, leaving only [40−(2×14)−5=7 nm] as the critical dimension for the CT width. Achieving the 40 nm spacing requires precisely locating the CT pillars between the respective gate edges.

Compound device structures including both logic elements and SRAM elements add the requirement that the CT pillars of the SRAM devices be offset, or asymmetrically spaced between the respective FET fins of the device, while the CT pillars of the logic device are symmetrically spaced between the fins of the device. What is needed is a precise method to create finFET structures having logic devices with symmetrically spaced CT pillars in conjunction with SRAM devices having asymmetrically spaced CT pillars at the desired dimensions.

Figure 1:
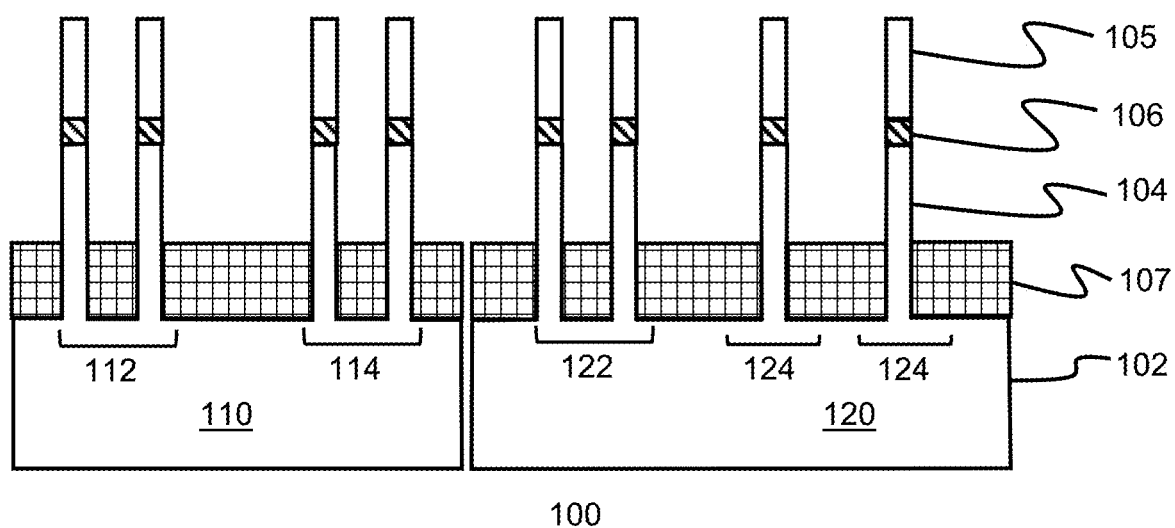
FIGS. 1-10 provide cross-sectional views of a method for forming CT pillars for a combined logic and SRAM structure, according to an embodiment of the invention.

FIG. 1 provides a cross-sectional view of a semiconductor structure 100 at an intermediate stage of production. The semiconductor structure 100 of FIG. 1 includes logic device 110 and SRAM device 120. The structure comprises a plurality of fins 104 extending from a substrate layer 102. Non-limiting examples of substrate layer 102 materials include: Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

The fins 104 are formed by, for example, a photolithographic patterning and etching process such as reactive ion etching (RIE) that removes exposed portions of the substrate layer 102 to form the fins 104. The fins may include an upper dummy gate layer 105 of polycrystalline Si and a passivation layer 106 disposed between the substrate/fin material and the polycrystalline Si layer.

FIG. 1 also illustrates shallow trench isolation (STI) regions 107 adjacent to the fins 104. The STI regions 107 can be formed by, any suitable process including, for example, lithography or etching to form trenches, and then filling the trenches with an insulating material, such as silicon dioxide. Following the deposition of the STI material, an etching process can be performed to remove portions of the STI material and expose the fins 104.

The isolation region 107 provides isolation between neighboring gate structure regions and can be used when the neighboring gates have opposite conductivities, e.g., nFETs and pFETs. As such, the isolation region 107 separates an nFET element 122 from a pFET element 124 of SRAM device 120.

Figure 2:
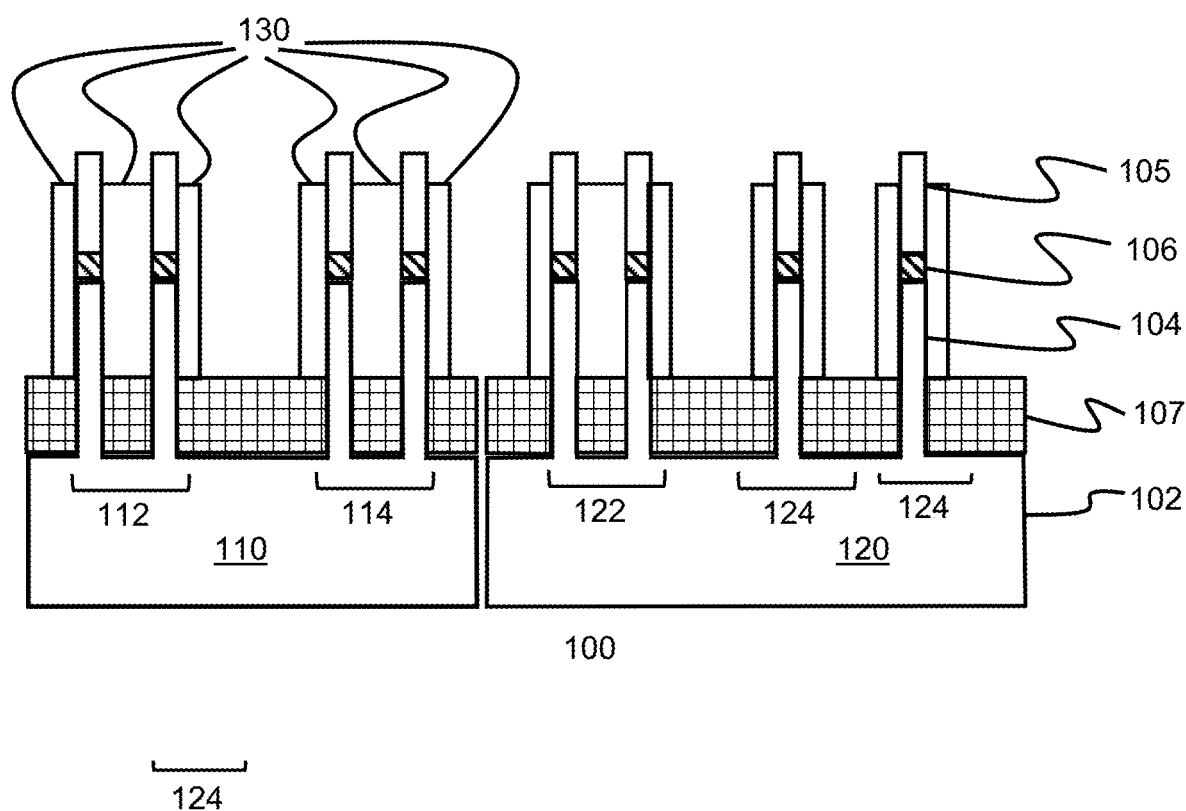

In an embodiment, a first sacrificial gate layer 130 is deposited upon the structure and partially removed using RIE or other methods to yield the structure illustrated in FIG. 2. As shown in the figure, the spaces between nFET fins 112, 114, and 122 are completely filled by the layer 130. The spaces between nFET structures 112 and 114, spaces between pFET structures 124, and spaces between nFET and pFET, 122 and 124, are not completely filled by layer 130. Layer 130 may be formed of amorphous Si, (aSi), polycrystalline Si, or other suitable sacrificial layer materials. The sacrificial gate layer material can be deposited by a deposition process, including, but not limited to, physical vapor deposition (PVD), chemical vapor deposition (CVD), atomic layer deposition (ALD), plasma enhanced chemical vapor deposition (PECVD), inductively coupled plasma chemical vapor deposition (ICP CVD), or any combination thereof.

Figure 3:
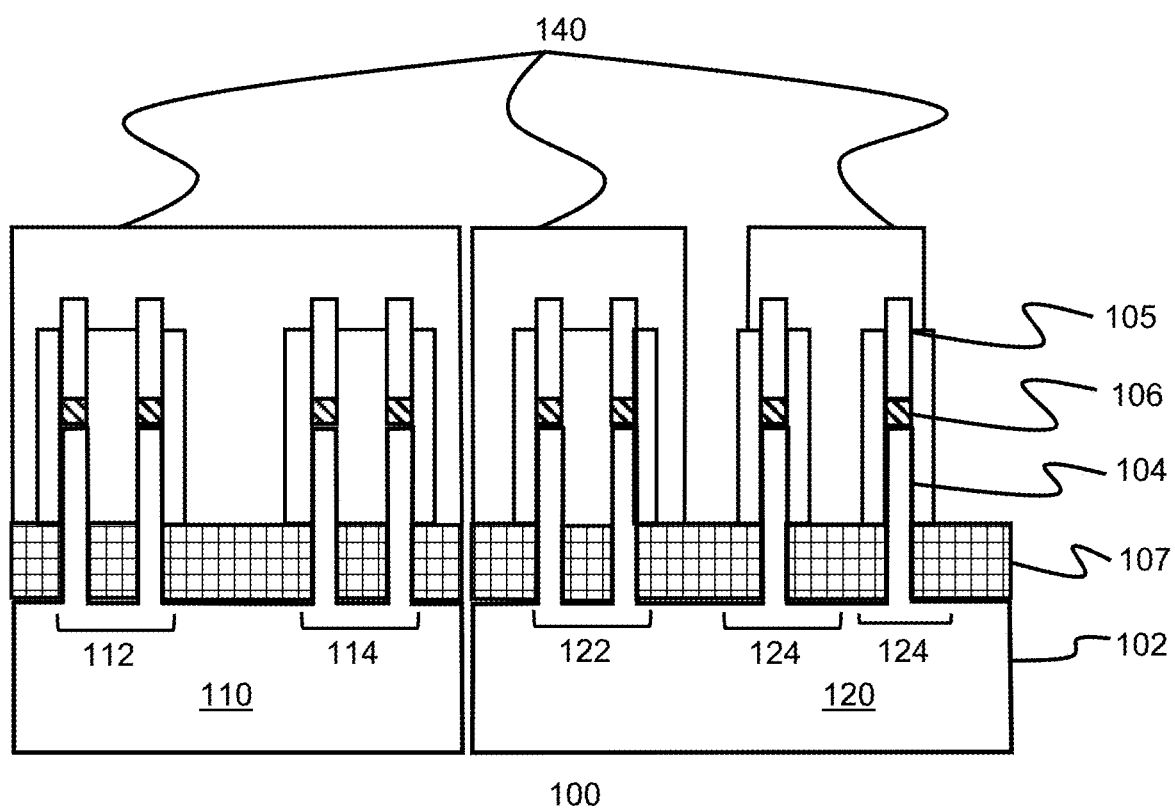

As shown in FIG. 3, a patterning mask layer, such as a developable organic planarization layer, is disposed and developed upon the structure using photo-lithographic techniques. Unexposed portions of the layer 130 are then removed from the structure. The mask layer covers and protects the logic device 110, the nFET element 122 of the SRAM device 120 structure, and the inner portion of the pFET element 124 of the SRAM device 120 structure.

Figure 4:
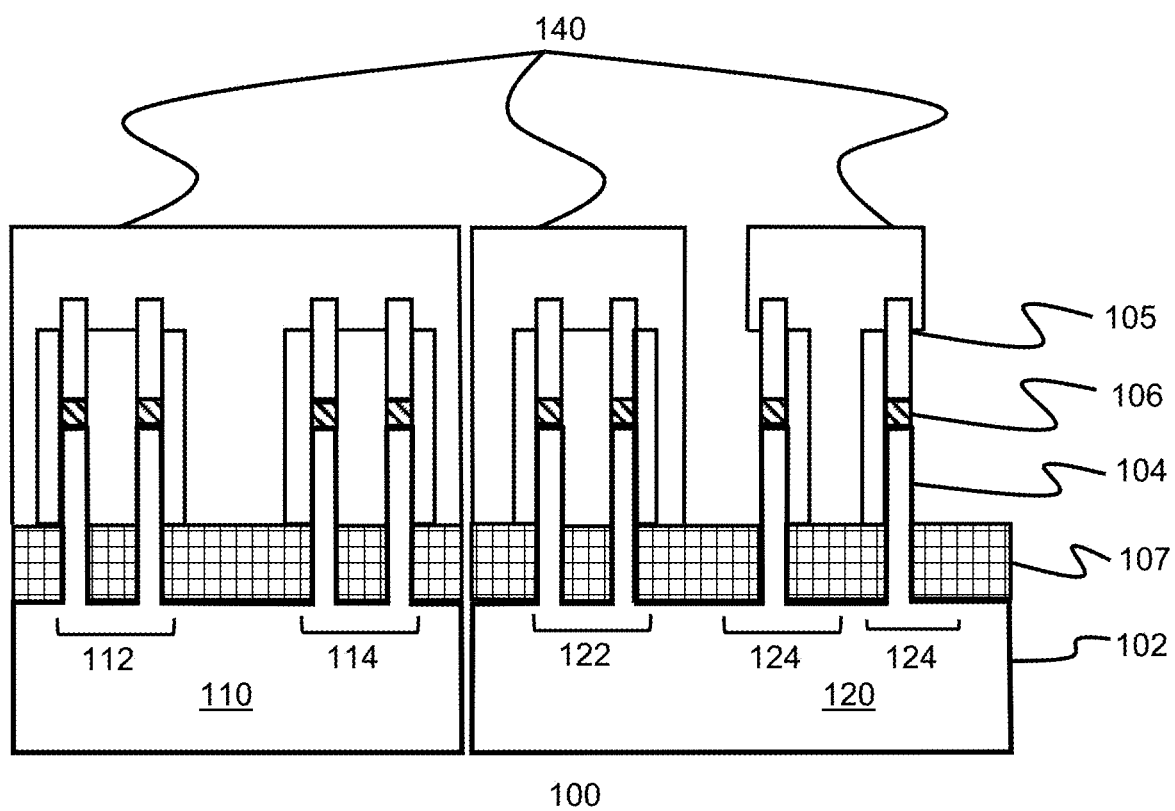
Figure 5:
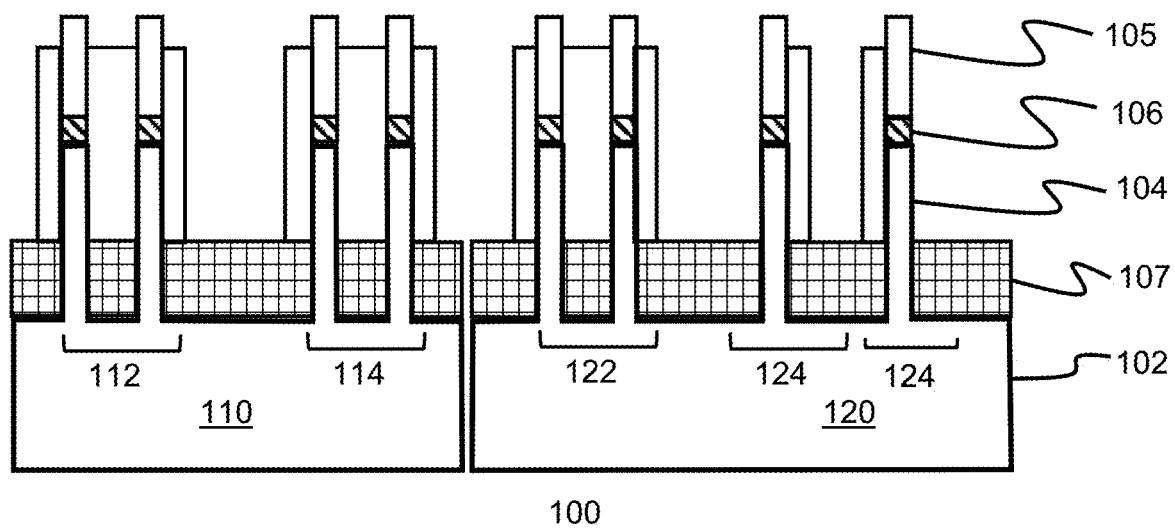

FIG. 4 illustrates the structure 100 of FIG. 3 after isotropic etching to remove exposed portion of the first sacrificial gate layer 130 from the external facing portions of the pFET element 124 fins of the SRAM device 120 structure. The removal of these sacrificial gate layer 130 portions creates an asymmetrical spacing between the pFET element 124 and nFET element 122 of the SRAM device 120. FIG. 5 illustrates a cross-sectional view of structure 100 after the mask layer 140 has been removed by an ashing process. Ashing can be performed using a plasma etch with a suitable reaction gas, for example, O2, N2, H2/N2, O3, CF4, or any combination thereof.

Figure 6:
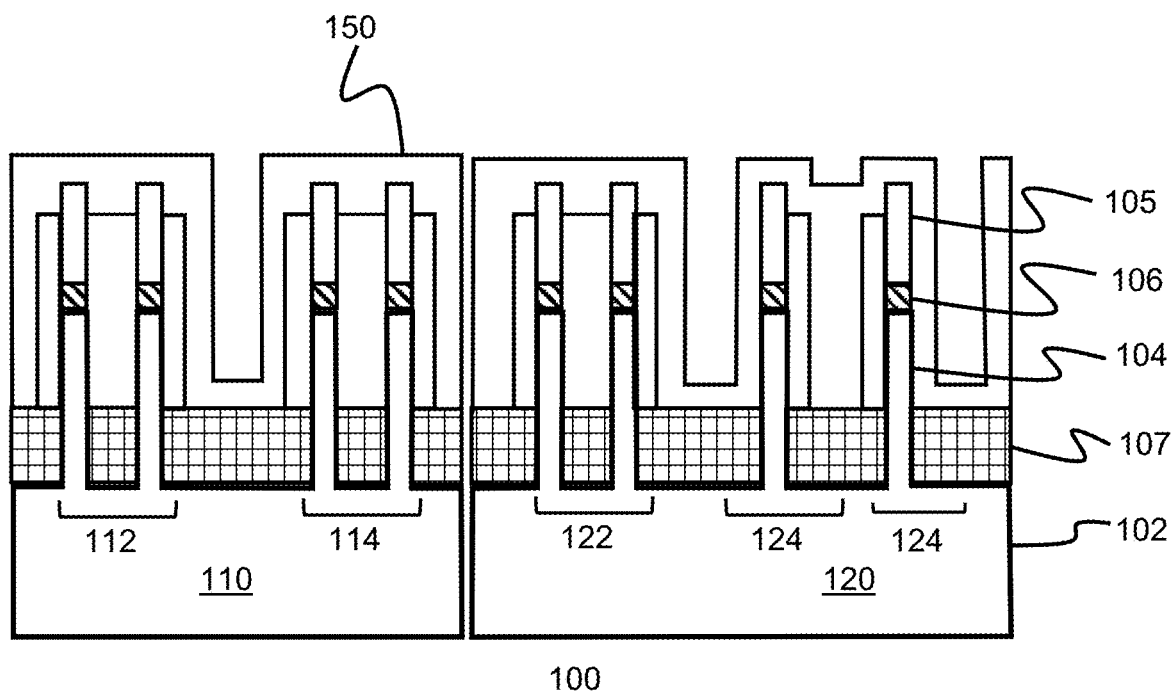

A second sacrificial gate layer 150 is deposited upon the structure 100 as illustrated in FIG. 6. Layer 150 completely fills the spaces between the logic device 110 and the SRAM device 120, as well as the spacing between the pFET elements 124 of the SRAM device 120. Layer 150 reduces the spacing between the Logic device 110 elements and the nFET element 122 and pFET element 124, of the SRAM device 120. Layer 150 may be formed of amorphous Si, (aSi), polycrystalline Si, or other suitable sacrificial layer materials. The sacrificial gate layer material can be deposited by a deposition process, including, but not limited to, physical vapor deposition (PVD), chemical vapor deposition (CVD), atomic layer deposition (ALD), plasma enhanced chemical vapor deposition (PECVD), inductively coupled plasma chemical vapor deposition (ICP CVD), or any combination thereof.

Figure 7:
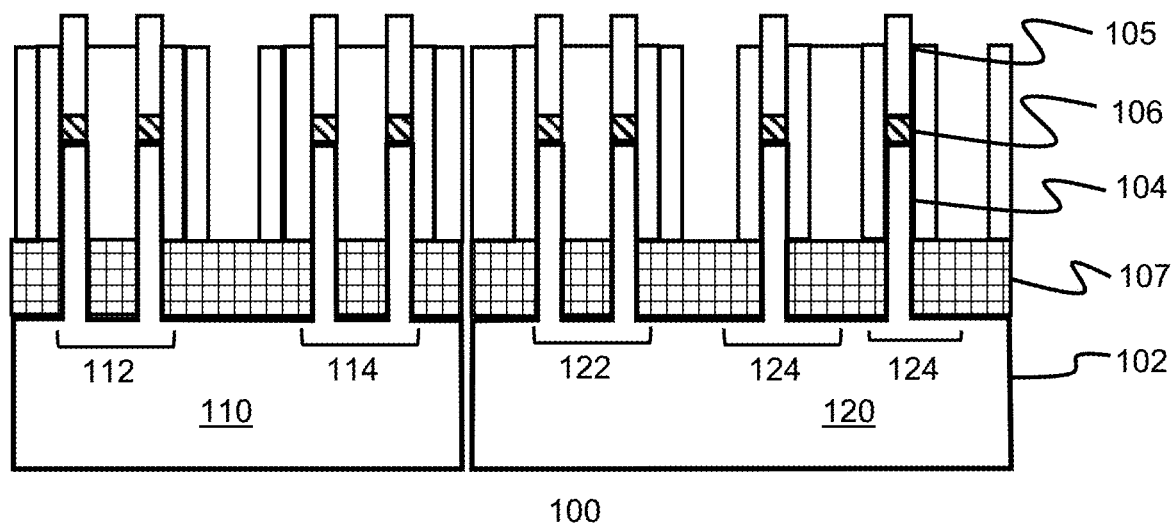

Horizontal portions of second sacrificial layer 150 are removed using anisotropic etching methods, revealing the structure 100 illustrated in FIG. 7.

Figure 8:
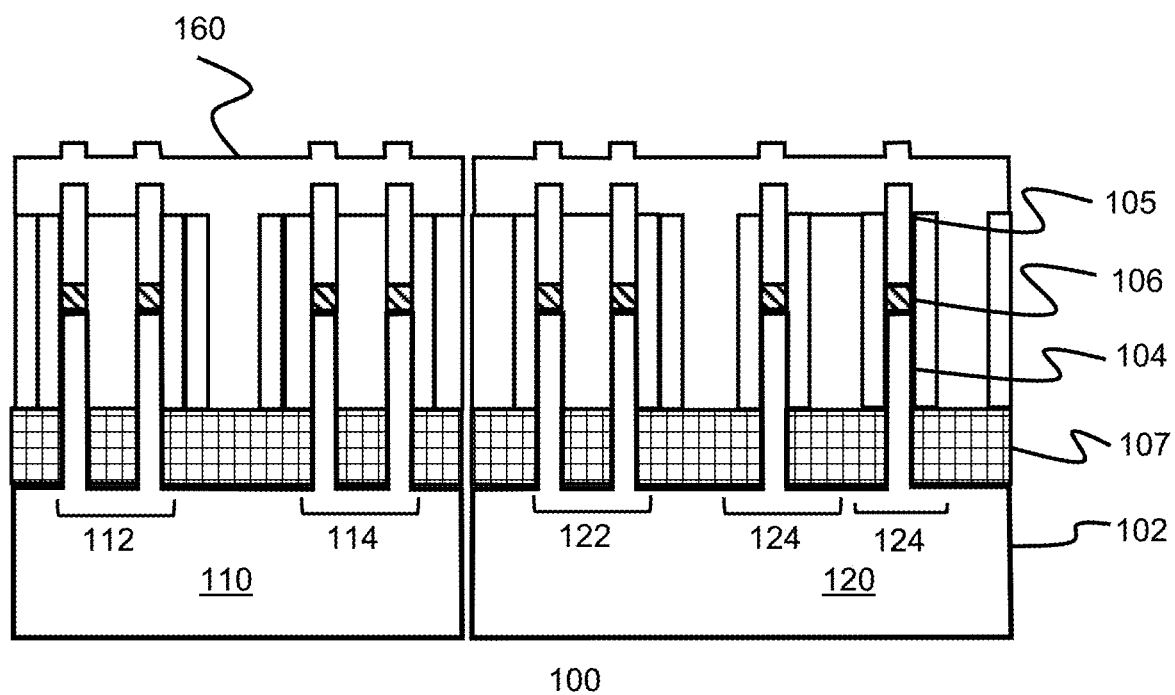
Figure 9:
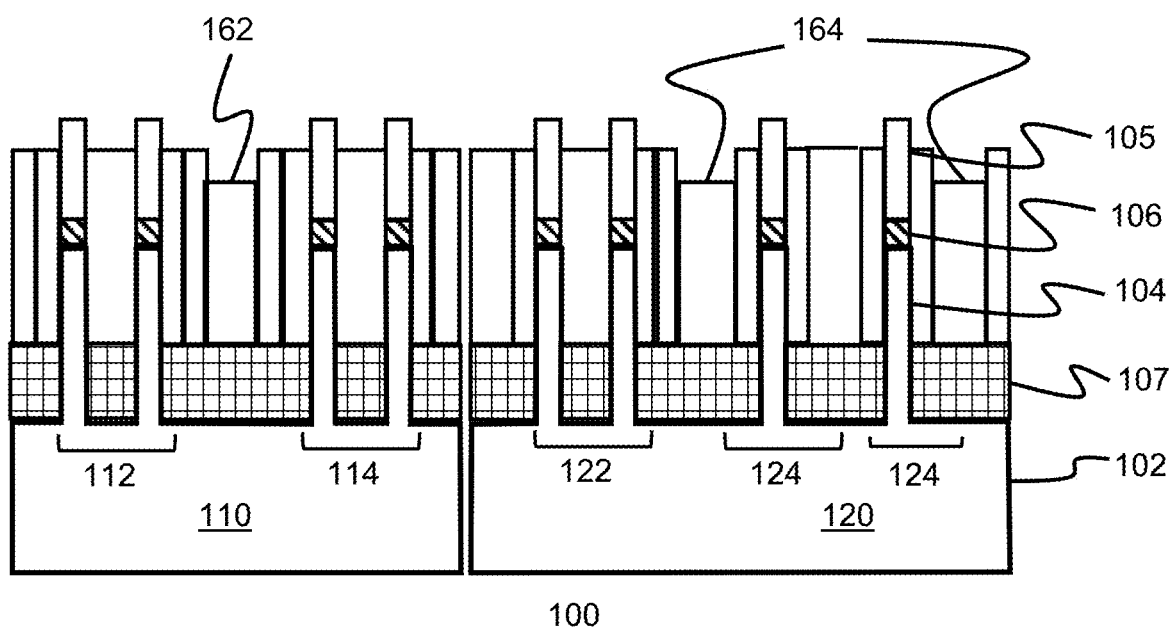

FIG. 8 illustrates structure 100 after deposition of a dielectric layer 160, such as SiN, SiO2, HfO2, or other suitable materials, using ALD. FIG. 9 illustrates a cross-section of structure 100 after portions of dielectric layer 160 have been removed by an etching process. As shown in the figure, portions of dielectric layer 160 form the CT pillars in the voids remaining after the previous steps of the process. CT pillar 162 of logic device 110, is disposed symmetrically between the elements 112 and 114 of logic device 110. CT pillar 164 of the SRAM device 120 is disposed asymmetrically between the pFET element 124 and nFET element 122 and is closer to the pFET element 124 than the nFET element 122. The top surfaces of CT pillars 162, and 164 are above the top surface of fins 104 and below the top surface of the HK/MG stack structure 170. than the adjacent fins 104 of structure 100.

Figure 10:
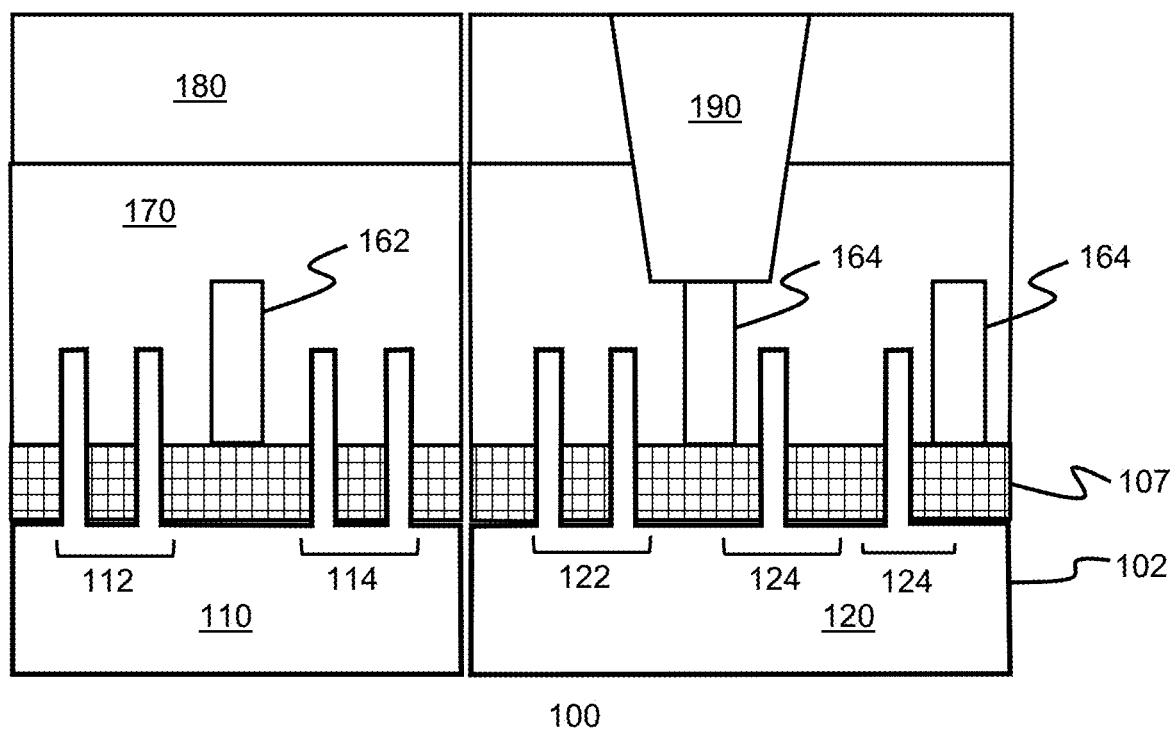

FIG. 10 provides a cross-sectional view of structure 100 after removal of any remaining sacrificial gate layers 130 and 150 from the structure and the formation of the HK/MG stack structure 170. A self-aligned contact layer (SAC) 180, is also shown in the figure. Dielectric CT cut 190 passing through the SAC 180 and HK/MG stack structure 170 provides contact with underlying CT pillar 164. CT cut 190 may be formed by removing portions of the SAC 180 and HK/MG stack structure 170 material using an etching process, then depositing the desired dielectric CT cut material and planarizing the structure after deposition. The semiconductor structures of the disclosure may be used in integrated circuit chips and as parts of computer processors and systems. In an embodiment, the critical dimension of the CT pillar 164 is less than the critical dimension of the upper CT cut 190 disposed above and in contact with CT pillar 164.

Figure 11:
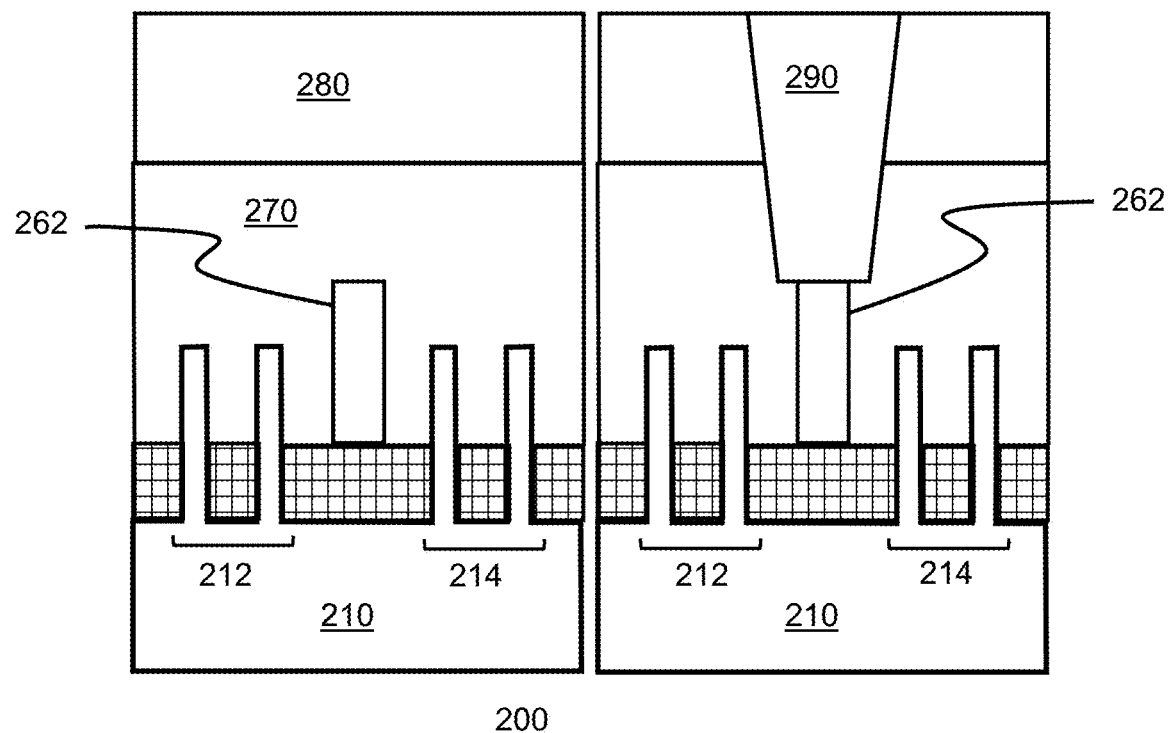
FIG. 11 provides a cross-sectional view of a logic structure including CT pillars, according to an embodiment of the invention.

In an embodiment, illustrated in FIG. 11, a logic only device 200 includes CT pillars 262, disposed symmetrically between elements 212 and 214 of the logic devices 210. HK/MG layer 270 is disposed above the CT pillars 262, and SAC layer 280 is disposed above the HK/MG layer 270. As shown in the figure, a dielectric-filled CT cut 290, is disposed in contact with one of the two CT pillars 262.

Figure 12:
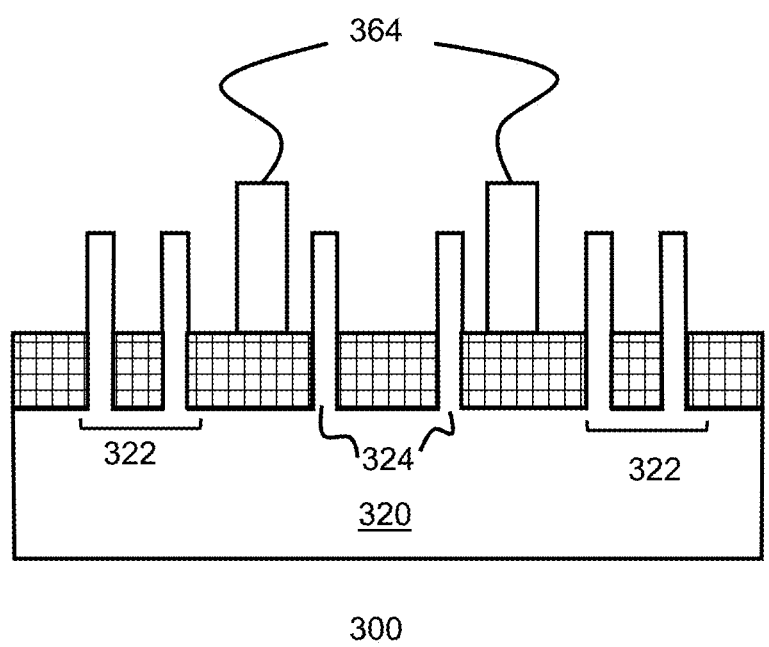
FIG. 12 provides a cross-sectional view of an SRAM structure, according to an embodiment of the invention.

In an embodiment illustrated in FIG. 12, a semiconductor structure 300 comprising only SRAM devices 320 may be formed using the disclosed methods for forming asymmetrically spaced CT pillars 364 in the SRAM devices 320 of the structures. The figure provides a cross-sectional view of the structure 300 at an intermediate stage of fabrication, after CT pillars 364 have been formed. In this embodiment, the semiconductor structure 300 may comprise fewer than three active regions. The CT pillars 364 may be formed between the pFET 324 and nFET 322 of the SRAM device.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the Figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   at least three active regions comprising gate terminals; and
   dielectric pillars disposed between active regions of the integrated circuit;
   wherein an SRAM device pillar is disposed asymmetrically between a p-channel field effect transistor (pFET), and an n-channel field effect transistor (nFET); and
   wherein a logic device pillar is disposed symmetrically between two active regions.

2. The semiconductor device according to claim 1, wherein the SRAM device pillar is disposed closer to the pFET than the nFET.

3. The semiconductor device according to claim 1, further comprising a dielectric gate cut disposed above a pillar.

4. The semiconductor device according to claim 1, further comprising gate metal disposed above a pillar.

5. The semiconductor device according to claim 1, wherein a top surface of a pillar is disposed higher than a top surface of a fin.

6. The semiconductor device according to claim 1, wherein a top surface of a pillar is disposed below a top surface of a gate terminal.

7. The semiconductor device according to claim 1, wherein the SRAM device pillar is disposed closer to the pFET than the nFET, further comprising:
   a dielectric gate cut disposed above a first pillar; and
   gate metal disposed above a second pillar.

8. A semiconductor device having SRAM devices, the semiconductor device comprising:
   at least three active regions; and
   a dielectric pillar disposed between two active regions;
   wherein an SRAM device pillar is disposed asymmetrically between a p-channel field effect transistor (pFET), and an n-channel field effect transistor (nFET); and
   wherein a logic device pillar is disposed symmetrically between two active regions.

9. The semiconductor device according to claim 8, wherein the SRAM device pillar is disposed closer to the pFET than the nFET.

10. The semiconductor device according to claim 8, further comprising a dielectric gate cut disposed above a pillar.

11. The semiconductor device according to claim 8, wherein a top surface of a pillar is disposed higher than a top surface of a fin.

12. The semiconductor device according to claim 8, wherein the SRAM device pillar is disposed closer to the pFET than the nFET, further comprising:
   a dielectric gate cut disposed above the SRAM device pillar.

* * * * *